(12) United States Patent
Lillaney et al.

(10) Patent No.: US 7,701,215 B2
(45) Date of Patent: Apr. 20, 2010

(54) MR COMPATIBLE ROTATING ANODE X-RAY TUBE

(75) Inventors: Prasheel Lillaney, Stanford, CA (US); Rebecca Fahrig, Palo Alto, CA (US); Arundhuti Ganguly, San Jose, CA (US); Norbert J. Pelc, Los Altos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 225 days.

(21) Appl. No.: 12/038,237

(22) Filed: Feb. 27, 2008

(65) Prior Publication Data
US 2009/0212775 A1  Aug. 27, 2009

(51) Int. Cl.
*G01V 3/00* (2006.01)
(52) U.S. Cl. ...................................... 324/318; 324/322
(58) Field of Classification Search ......... 324/300–322; 600/407–445, 25, 12, 44; 355/205, 207; 378/138
See application file for complete search history.

(56) References Cited

U.S. PATENT DOCUMENTS

| | | | |
|---|---|---|---|
| 6,658,085 B2 | 12/2003 | Sklebitz | |
| 6,788,062 B2 | 9/2004 | Schweikard et al. | |
| 6,810,110 B2 * | 10/2004 | Pelc et al. | 378/138 |
| 6,973,162 B2 * | 12/2005 | Block et al. | 378/63 |
| 6,976,953 B1 * | 12/2005 | Pelc | 600/411 |
| 2005/0136002 A1 | 6/2005 | Fossheim et al. | |

OTHER PUBLICATIONS

Lillaney et al., "Development of an MR Compatible Rotating Anode X-Ray Tube," Proc. SPIE, vol. 6913, 691347, 10 pages, 2008.
Vogl et al., "Hybrid MR interventional imaging system: combined MR and angiography suites with single interactive table. Feasibility study in vascular liver tumor procedures," European Radiology, vol. 12, No. 6, pp. 1394-1400, 2002.

* cited by examiner

*Primary Examiner*—Brij B Shrivastav
(74) *Attorney, Agent, or Firm*—Beyer Law Group LLP (57) ABSTRACT

An apparatus for use in a magnetic resonance (MR) system, which generates an external MR magnetic field, is provided. A rotor comprises a rotor shaft with an axis along a length of the rotor shaft and a plurality of coils on the rotor shaft. A housing supports and surrounds the rotor, where a part of the housing surrounds sides of the rotor and where the part of the housing surrounding sides of the rotor is magnet free. A mount allows for the mounting of the housing to the MR system in a location where the MR system provides a magnetic field, wherein a component of the MR magnetic field that is perpendicular to the axis of the rotor shaft is at least 100 Gauss. An active timer applies a voltage to the plurality of coils with alternating polarity. Contacts provide an electrical connection between the active timer and the plurality of coils.

18 Claims, 7 Drawing Sheets

0 Gauss    195 Gauss         0 Gauss    195 Gauss

Solenoid Geometry in the FEM

View from the X axis​ ​ ​ ​ View from the Y axis

Solenoid Geometry for Correction Along Two Spatial Directions

MR COMPATIBLE ROTATING ANODE X-RAY TUBE

BACKGROUND OF THE INVENTION

This invention relates generally to magnetic resonance imaging (MRI). More specifically, the invention relates to a rotating anode x-ray tube for MRI.

Figure 1:
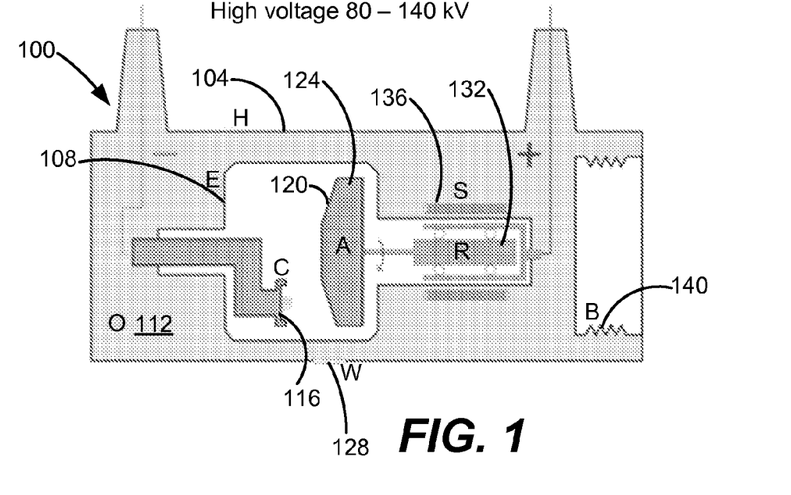
FIG. 1 is a simplified diagram of a rotating anode x-ray tube used in the prior art.

A simplified diagram of a rotating anode x-ray tube used in the prior art is shown in FIG. 1. The rotating anode x-ray tube 100 comprises a housing 104, a glass envelope 108 for maintaining a vacuum around the cathode and anode, insulating oil 112, a cathode and focusing cup 116, a target 120, an anode 124, an x-ray window 128, a rotor 132, a stator 136, and expansion bellows 140. During conventional use the tungsten wire filaments held in the focusing cup are heated to ~2200° C. causing electrons to be boiled off the wire surface by the process of thermionic emission. The large potential difference (on the order of 100 kV) between the cathode and anode causes the high-energy electrons that are boiled off the tungsten wire to accelerate towards and bombard the anode creating x-rays. Due to the inefficiency of this process, less than 1% of the electron beam energy is converted to x-ray energy; a tremendous amount of heat is deposited on the anode. By rotating the anode during the exposure process, the deposited heat is spread out along the circumference of the anode, which increases the instantaneous heat loading capability of the x-ray tube thus enhancing the x-ray output relative to a static anode.

SUMMARY OF THE INVENTION

In accordance with the invention, an apparatus for use in a magnetic resonance (MR) system which generates an external MR magnetic field, is provided. A rotor comprises a rotor shaft with an axis along a length of the rotor shaft and a plurality of coils on the rotor shaft. A housing supports and surrounds the rotor, where a part of the housing surrounds sides of the rotor and where the part of the housing surrounding sides of the rotor is magnet free. A mount allows for the mounting of the housing to the MR system in a location where the MR system provides a magnetic field, wherein a component of the MR magnetic field that is perpendicular to the axis of the rotor shaft is at least 100 Gauss. An active timer applies a voltage to the plurality of coils with alternating polarity. Contacts provide an electrical connection between the active timer and the plurality of coils.

In another manifestation of the invention an x-ray tube for use in a magnetic resonance (MR) system, which generates an external MR magnetic field is provided. An anode is provided. A motor rotates the anode. A cathode is spaced apart from the anode. An external magnetic field sensor measures the external MR magnetic field. A plurality of active shielding magnets is spaced surrounding a path from the cathode to the anode. A controller is connected to the external magnetic field sensor and the plurality of active shielding magnets.

In another manifestation of the invention, an x-ray tube for use in a magnetic resonance (MR) system, which generates an external MR magnetic field is provided. An anode is provided. A motor for rotating the anode, comprising a rotor, comprising a rotor shaft with an axis along a length of the rotor shaft and a plurality of coils on the rotor shaft, a housing supporting and surrounding the rotor, wherein a part of the housing surrounds sides of the rotor, wherein the part of the housing surrounding sides of the rotor is magnet free. A mount allows mounting the housing to the MR system in a location where the MR system provides a magnetic field, wherein a component of the MR magnetic field that is perpendicular to the axis of the rotor shaft is at least 100 Gauss. An active timer applies a voltage to the plurality of coils with alternating polarity. Contacts provide an electrical connection between the active timer and the plurality of coils. A cathode is spaced apart from the anode.

The invention and objects and features thereof will be more readily apparent from the following detailed description and appended claims when taken with the drawings.

DETAILED DESCRIPTION OF ILLUSTRATED EMBODIMENTS

When placing the device shown in FIG. 1 in an MR fringe field, two major concerns arise; the positioning, size, and shape of the focal spot on the anode and the operation of the induction motor used to turn the anode. Any external magnetic field will alter the motion of the electrons during their transit from the cathode to the anode. The exact nature of the electron beam deflection will depend upon the external field strength and direction. The highest fields expected in this position of the tube will be the radial fringe fields (~1000 gauss), which will be along the axis of the tungsten filaments. These radial fields could lead to electron beam deflections on the order of 15 mm, exceeding the operating parameters if not corrected for.

When an induction motor is operating in the presence of an external magnetic field, the stator soft iron ring becomes partially magnetized by the external field, in addition to the magnetization produced by the stator coils. These effects might impact the performance of the motor and hence decrease the frequency (f) of anode rotation.

Figure 11:
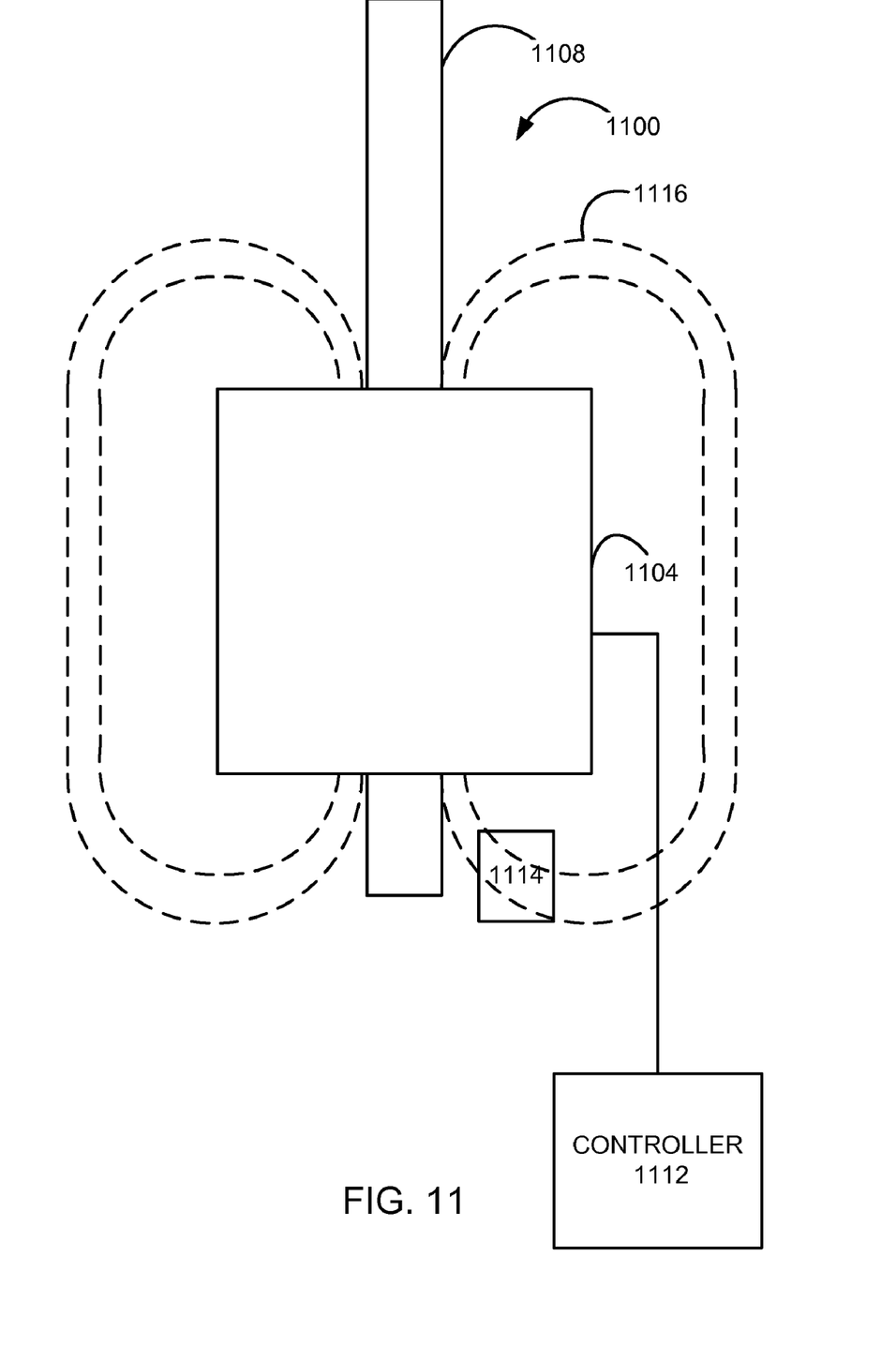
FIG. 11 is a schematic top view of a magnetic resonance imaging (MRI) system that may be used in an embodiment of the invention located near the rest of the MRI system.

To facilitate understanding of the invention, FIG. 11 is a schematic top view of a magnetic resonance imaging (MRI) system 1100 that may be used in an embodiment of the invention, where an x-ray tube is 1114 located near the rest of the MRI system 1100. The MRI system 1100 comprises a magnet system 1104, a patient transport table 1108 connected to the magnet system, a controller 1112 controllably connected to the magnet system, and an anode x-ray tube placed close to the bore of the magnetic system 1100. In one example, a patient would lie on the patient transport table 1108 and the magnet system 1104 would pass around the patient. The controller 1112 would control magnetic fields including the radio frequency (RF) field provided by the magnet system 1104 and would receive signals from detectors in the magnet system 1104. The magnetic system 1104 would create an external magnetic field, schematically illustrated by field lines 1116. An embodiment of the invention uses the external magnetic field to rotate the anode and provides compensation for distortion provided by the external magnetic field by providing a magnetic resonance compatible rotating anode x-ray tube.

A magnetic resonance compatible rotating-anode x-ray tube will enable the highest quality x-ray and magnetic resonance (MR) imaging during interventional procedures that require multiple iterations of the following two steps: 1) precise positioning of a micro-catheter or micro-device, and 2) soft-tissue examination such as verification of placement in 3D, treatment monitoring, or acquisition of physiological information. Placing an x-ray tube as close as physically possible to a short-bore high-field MR magnet allows switching between modalities with a minimum of disturbance to critically placed catheters and other devices. Such a highly integrated system could lead to a reduction in total time, risk and dose of procedures, an increase in procedure accuracy, and perhaps most significantly, the development of new, unanticipated minimally invasive procedures. Using a rotating anode design eliminates the major limitation observed in a 0.5 T SP-XMR system which is x-ray tube output. X-ray tube design requirements, in an embodiment of the invention, are intended to permit placement of a high-output x-ray tube right next to a 1.5 T magnet. However, other embodiments are applicable in the higher-field environment of 3.0 T magnets.

Figure 2:
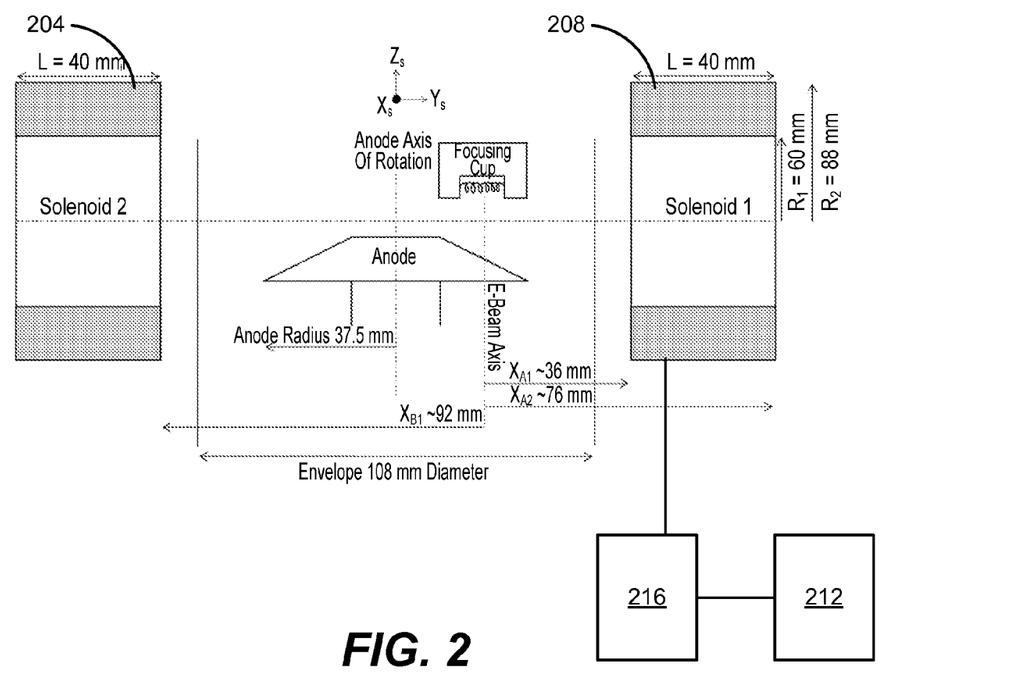
FIG. 2 is a simplified diagram of a solenoid system used by an embodiment of the invention.

In order to correct for the shift in focal spot position, an embodiment of the invention uses a pair of finite solenoids to create a field in the opposite direction of the external radial field. Using the geometry shown in FIG. 2, it is possible to generate a field of 900 to 1000 Gauss from the two solenoids 204, 208 with 1 mm diameter Cu wire carrying 15 Amps of current. The coils will be placed outside the tube envelope but within the tube housing. The field generated by such a coil pair will not be uniform over the electron beam area, and finite element modeling is required to optimize coil placement and field strengths. An embodiment of the invention monitors the current being used in the deflection coil system using a feedback control mechanism. By using Hall sensors 212 mounted on the tube housing it is possible to monitor changes in magnetic field density in the radial direction when the tube moves into different positions (e.g. when oblique views are required). A controller 216 is connected to the sensor 212 and the solenoids 204, 208. The controller may comprise computer readable media with computer readable code for sensing a signal from the sensor 212 that indicates the external magnetic field of the MR system and then adjusting the magnetic field of the solenoids accordingly to compensate for the external magnetic field of the MR system. In such a case, the controller 216 receives a signal from the sensor 212 to indicate the strength of the external magnetic field and causes the solenoids 204, 208 to provide a magnetic field according to the strength of the measured external magnetic field to counter the external magnetic field. The output from the Hall sensors 212 can be used to determine whether to increase or decrease the coil current. In the embodiment shown in FIG. 2, the combination of the two coils can generate fields greater than 800 Gauss in a focal spot location in the direction opposite to $B_r$.

It is important to maintain high frequency to ensure proper distribution and dissipation of heat from the focal track to the body of the anode. It has been found that fields perpendicular to the rotor axis are most detrimental to motor operation. With a certain tube positioning, the radial fringe fields (~1100 Gauss at the motor position) will be perpendicular to the rotor axis and may cause the rotation speed of the anode to fall from 3600 RPM to below 2000 RPM. This drop off is not acceptable and as a result, alternatives using an AC induction motor have to be considered.

Figure 3A:
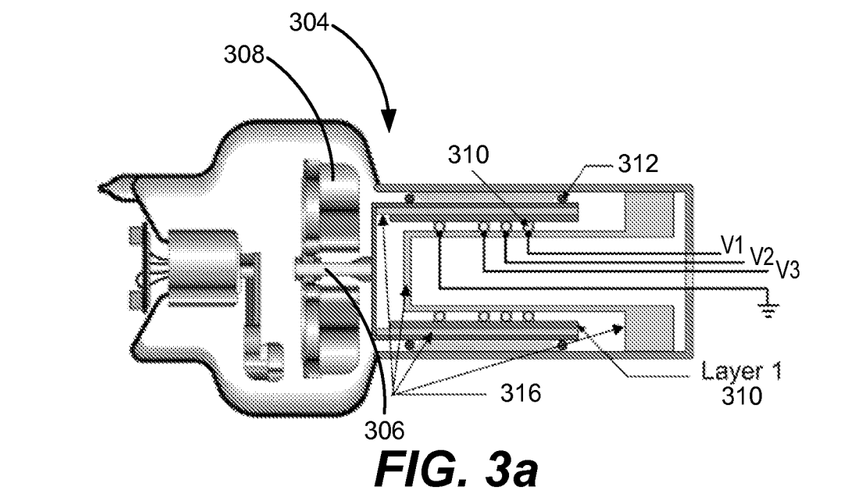
FIGS. 3a-c illustrate a brushless DC (BLDC) motor design used in an embodiment of the invention.
Figure 3B:
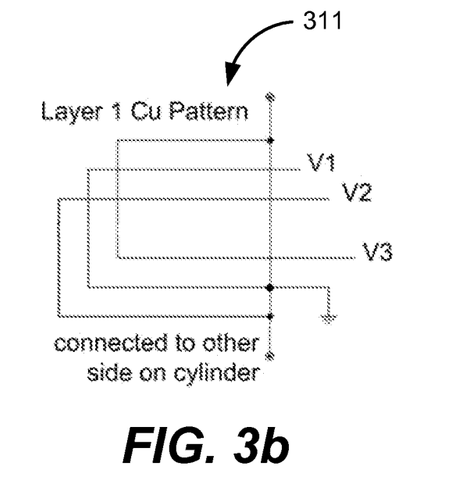
Figure 3C:
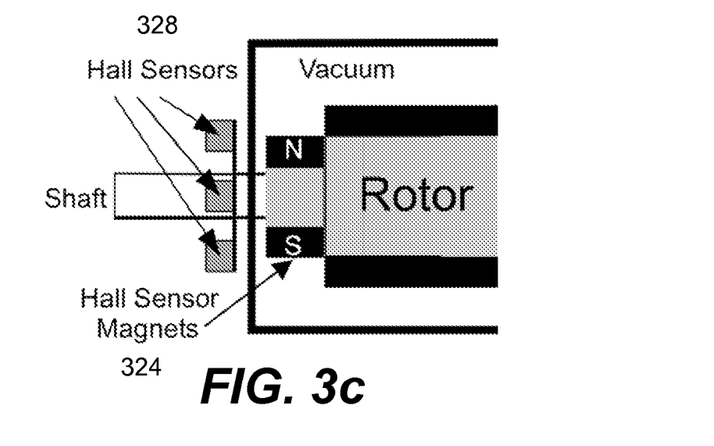

The brushless DC (BLDC) motor design is used in an embodiment of the invention, shown schematically in FIGS. 3a-c, which uses the external $B_r$ field at right angles to the axis of rotation of the motor to produce the required torque by energizing coil windings printed on the bearing sleeve in sequence. A DC motor 304 is attached to the shaft 306 of the anode 308. The low-voltage bearings 310 carry current sequentially to windings printed on Layer 1 311 with the pattern (rolled into a cylinder) shown in the middle. FIG. 3b is an enlarged planar view of Layer 1 311. For this 3-phase design, the current is fed to each winding through a single connection to each of 4 bearing races (the bearings turn but are not the primary weight-supporting bearings). The high voltage is carried to the anode via the larger outer bearings 312. Insulation 316 between the high voltage and lower voltage layers of the bearing sleeve prevents arcing. The layout of wires for this implementation of the motor is shown in FIGS. 3a and 3b. The torque produced by such a motor depends on the strength of the external magnetic field B, on the current carried by each coil i, and on the lever arm or distance from the center of rotation to the radius of the coil, r, according to $\tau = i \cdot B \cdot r$. Given the required torque of 0.02 N·m, the total current per coil winding can be solved for assuming the coils reside at a radius of 3 cm from the axis of rotation and are in an external field of 500 Gauss. For this case, 6.5 Amp-turns is sufficient to provide the required torque and this can be easily achieved using a single 1-mm-diameter wire, or more likely with multiple printed circuit loops per winding. Only one installation geometry, Cardiac Oblique, places the motor in a field less than 500 Gauss, since such a geometry may position the x-ray tube further away from the MR bore. For this case, a $B_r$ of only 250 Gauss, the current in the windings could be increased, or acceleration to speed will require more time. Using a finite element model current and winding geometries may be optimized for the field strengths and directions of interest. Because the DC motor uses the MR magnetic field, the housing around the rotor is magnet free.

Figure 4A:
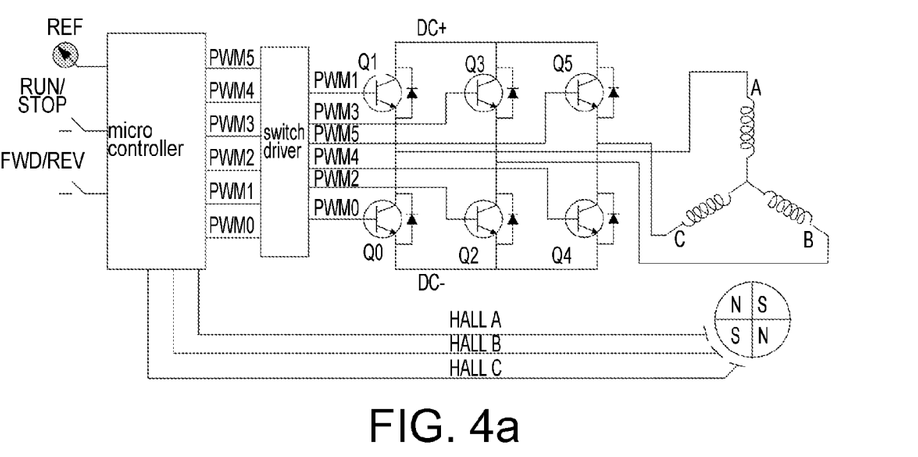
FIG. 4a shows a block diagram of a controller used in an embodiment of the invention.
Figure 4B:
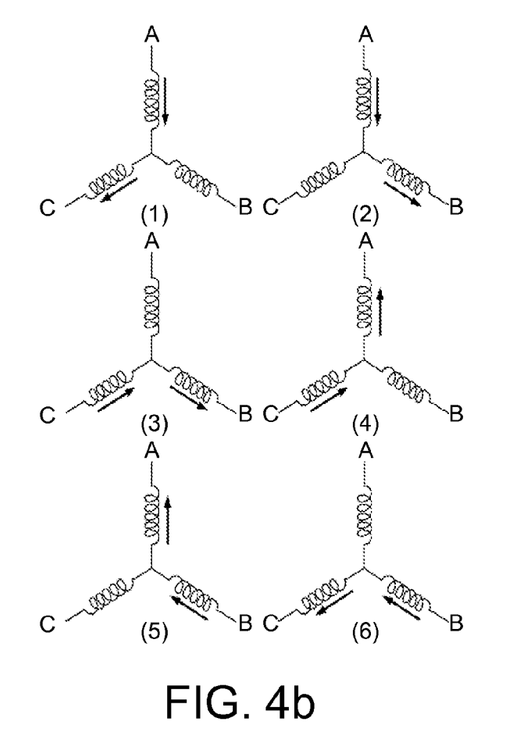
FIG. 4b illustrates a winding energizing sequence relative to the hall sensor signal.
Figure 4C:
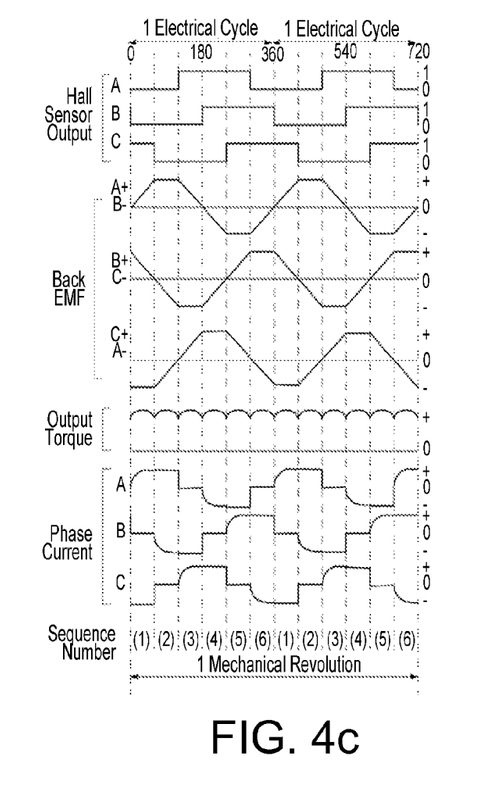
FIG. 4c illustrates corresponding Hall sensor signals, back EMF, output torque, and phase current.

The commutation of a BLDC motor is controlled electronically with sequential energizing of the windings. It is therefore important to know the rotor position in order to understand which winding will be energized. In this embodiment, rotor position is sensed by imbedding permanent magnets 324 onto the rotating shaft, and using Hall Effect sensors 328 on the static shaft to sense their position, as shown in FIG. 3c. The Hall-effect sensor system provides a signal to the microcontroller that controls the energizing sequence of windings. Each coil winding acts as a magnetic dipole, and therefore the rotor continuously attempts to align with the external magnetic field. An embodiment of the invention uses high-coercivity SmCo magnets (Dexter Magnetic Technologies, Elk Grove Village, Ill.) for shimming. These magnets have a high Curie temperature (>750° C.) and operating temperatures as high as 300° C., which is above the expected temperature of the end of the rotor shaft, as shown in FIG. 4c, and so are appropriate for use in this embodiment. In this embodiment, the Hall sensors will be placed outside of the vacuum. A control block diagram for the motor is shown in FIG. 4a with a winding energizing sequence with respect to the Hall sensor. FIG. 4a shows a block diagram of a controller used to control a 3-phase BLDC motor. Q0 to Q5 are power switches controlled by the microcontroller. The winding energizing sequence relative to the hall sensor signal is shown in FIG. 4b. The corresponding Hall sensor signals, back EMF, output torque, and phase current as shown in FIG. 4c.

This embodiment requires a timer that is actively timed by an active timer that provides an energizing in relation to the position of the rotor, instead of a motor that uses contacts to provide timing, which is done by controlling the polarity of the voltage applied to the coil contacts. Such an active timer receives input from the Hall sensors to indicate the position of the rotor and then determines the polarity that needs to be applied to the contacts of the coils. The microcontroller comprises a processing logic device and computer readable media with computer readable code that provides instructions for using the sensed rotor position to determine the polarity to apply to the contacts, and thus is the active timer. The active timing in relation to the position of the rotor also provides timing in relation to the position of the rotor to the external MR magnetic field.

While the Hall sensor system is the standard approach to commutation control in BLDC motors, it does not meet a 'no magnetic material' criterion. Therefore other embodiments use other devices to measure rotor position and speed sensing. Preferably, these other embodiments do not have permanent magnets. One potential solution is the use of an optical encoder system attached to the rotor, with a fiber optic feedthrough to carry the position signal out to the controller. Fiber optic glass is stable up to high temperatures, and can be easily fed between vacuum and atmosphere using a glass feedthrough on a Covar glass-metal seal. One implementation of such a system uses a lens-tipped cohere fiber-optic bundle fed to a CCD camera to image a pattern, and pattern recognition can then be applied to determine angular location. Another approach is to detect the zero-crossings of the back EMF signal from each of the windings. As a motor rotates, each winding generates a voltage, the back EMF, which opposes the main voltage supplied to the windings according to Lenz's Law. The polarity of the back EMF is in opposite direction of the energized voltage. This approach requires open-loop start-up of the motor (i.e. no feedback response) since the amplitude of the back EMF signal is too small to detect at very low speeds.

Some embodiments of the invention provided an ability to provide high quality X-Ray imaging in close proximity (~3 feet) to an MR bore, a DC motor design to replace an AC induction motor, a deflection coil system to correct for focal spot positioning and focusing with feedback mechanism, and NM-tube components for minimal impact on MR field homogeneity.

The preferred embodiment of the invention uses a DC motor design to drive the rotating anode that uses the radial MR fringe field to operate the motor. An embodiment that provides a combination of an electron optics correction mechanism with the new DC motor provides a design to make a completely MR compatible X-Ray tube.

A custom built X-ray tube (Rytech X-ray Inc.), from which all magnetic materials were either substituted or removed, was tested in external magnetic fields of up to 200 Gauss.

In a test using a conventional AC induction motor, a field was generated via a Helmholtz coil pair oriented either parallel or perpendicular to the axis of rotation of the anode. In the perpendicular orientation, which is of most concern due to a proposed positioning, the tube suffered a 27.0% reduction in rotation speed at a field of only 75 Gauss. These results led to the conclusion that it would not be possible to use an AC induction motor to rotate the anode without shielding the motor and thus compromising the MR field homogeneity. This experimental setup was also used to acquire focal spot images in the presence of the external field.

Figure 5A:
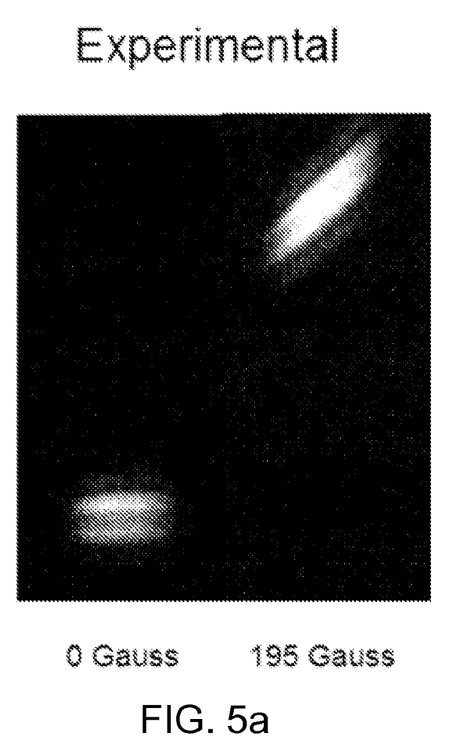
FIGS. 5a and b show results from simulation and experimental focal spot images acquired from a NM-tube.
Figure 5B:
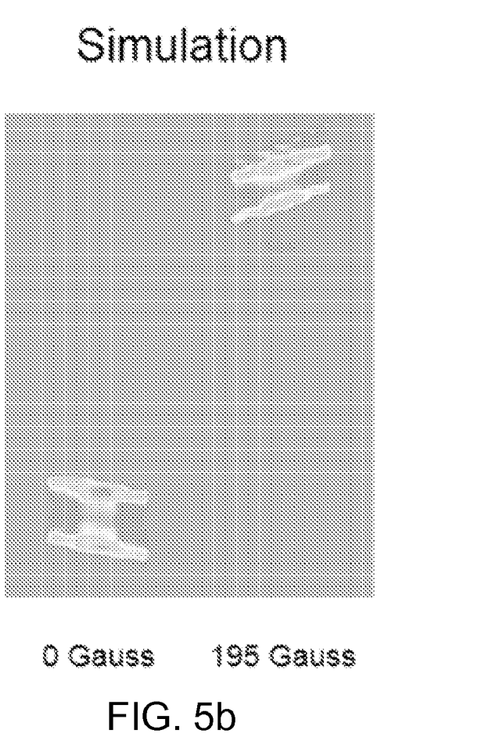

Simulations of the electron optics for the NM-tube provided by Rytech were performed over a range of magnetic field strengths and various directions using a finite element method program (OPERA-3d; Vector Fields, UK). The geometry of the cathode/anode arrangement in the NM-tube was carefully measured and then replicated in the finite element model (FEM). The results from the simulation were consistent with the experimental focal spot images acquired from the NM-tube, and a comparison is shown in FIGS. 5a and b, which show a comparison of experimental (FIG. 5a) and simulated (FIG. 5b) focal spot images for the NM-Tube in the presence of no external field (0 Gauss) and a small external field (195 Gauss) along the axis of the tungsten filaments.

Figure 6:
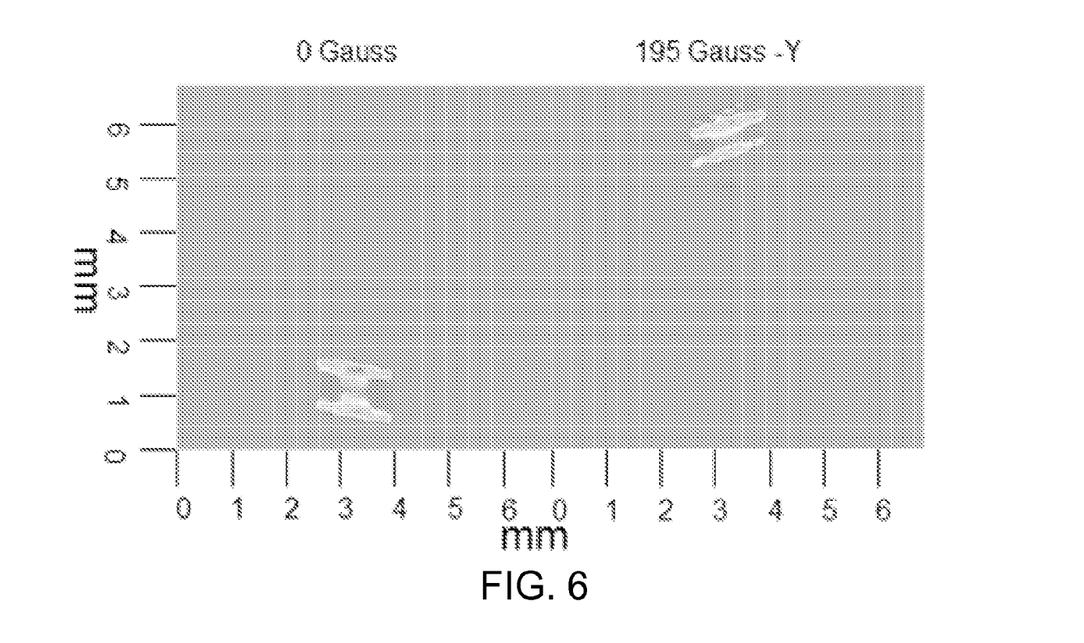
FIG. 6 is an expanded version of the simulation images displayed in FIG. 5b accompanied by a scale in millimeters.

These results lead to the FEM to extrapolate the behavior of the focal spot in higher magnitude multi-directional fields. FIG. 6 is an expanded version of the simulation images displayed in FIG. 5b accompanied by a scale in millimeters which displays that a field of 195 Gauss along the axis of the tube filaments (Y) can cause a shift in focal spot position of approximately 5 millimeters. An external field of 400 Gauss causes a shift in focal spot position of 10 millimeters along with further distortion of shape and slanting.

Figure 7:
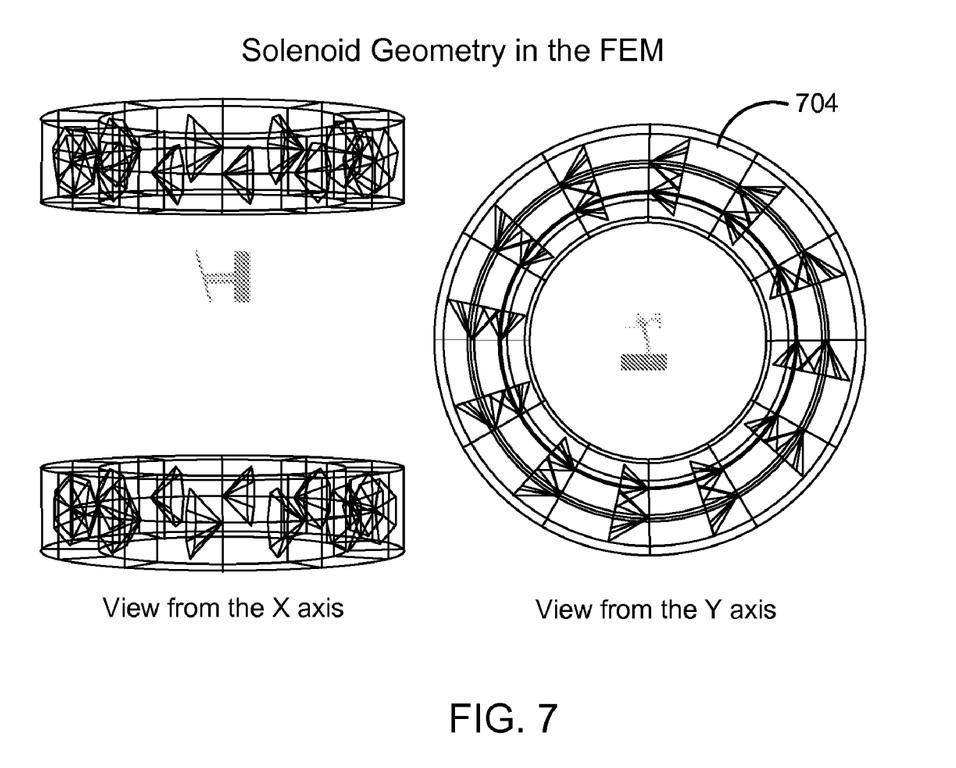
FIG. 7 shows images of a finite element model (FEM) with solenoids included from the X and Y axis.

The model was also expanded to include solenoids 704, shown in FIG. 7, that represent the deflection coil system described above in an embodiment of the invention, which enabled preliminary testing of how well the coils can correct for alterations in focal spot size, shape and position. FIG. 7 shows images of the FEM with solenoids included from the X and Y axis. Both solenoids contain a current density of 15 A/mm$^2$, and the inner face of each is positioned 36 and 92 mm away from the electron beam, respectively. Inner and outer radii are 60 and 88 mm respectively, and the length of each solenoid along the y-axis is 40 mm. The dimensions and positions of the solenoids were configured such they would generate approximately 900-1000 Gauss along the Y axis near the electron trajectories.

Figure 8:
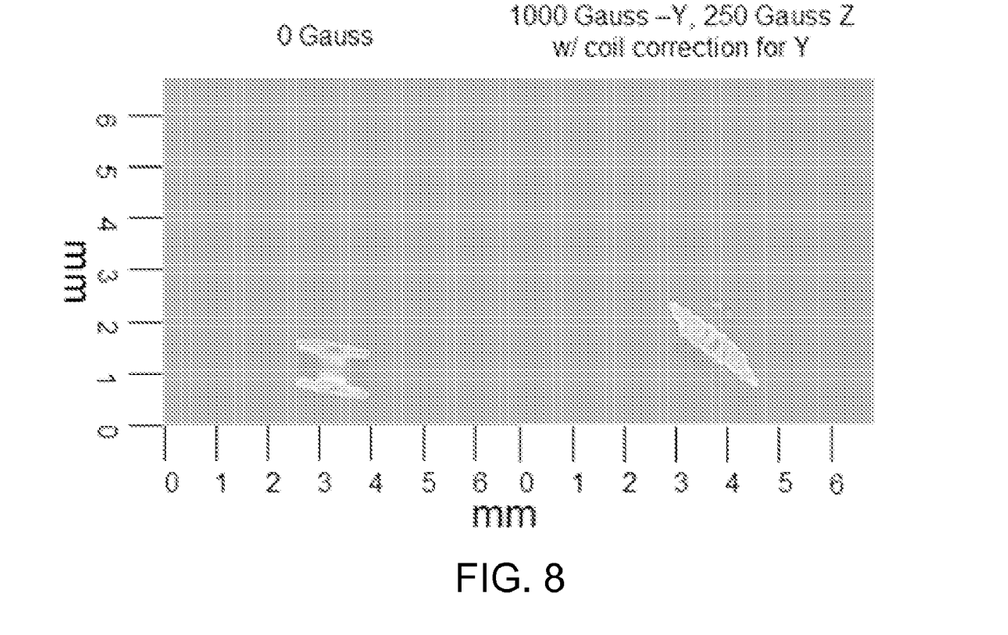
FIG. 8 shows a simulated focal spot comparison between no external field (0 Gauss) and a large magnitude multi-directional external field (1000 Gauss-Y, 250 Gauss Z) with coil correction along Y.

With the solenoids present, another simulation was carried out with an external field of negative 1000 Gauss along Y and 250 Gauss parallel to the anode-cathode axis (Z). The results for this simulation are shown in FIG. 8. FIG. 8 shows a simulated focal spot comparison between no external field (0 Gauss) and a large magnitude multi-directional external field (1000 Gauss-Y, 250 Gauss Z) with coil correction along Y.

These fields are representative of the worst case scenario in which the tube is tipped 30 degrees towards the magnet in cardiac oblique applications. However, with the presence of the solenoids the effect of these external fields on the focal spot are limited to blurring and slanting effects due to the 250 Gauss along Z.

Figure 9:
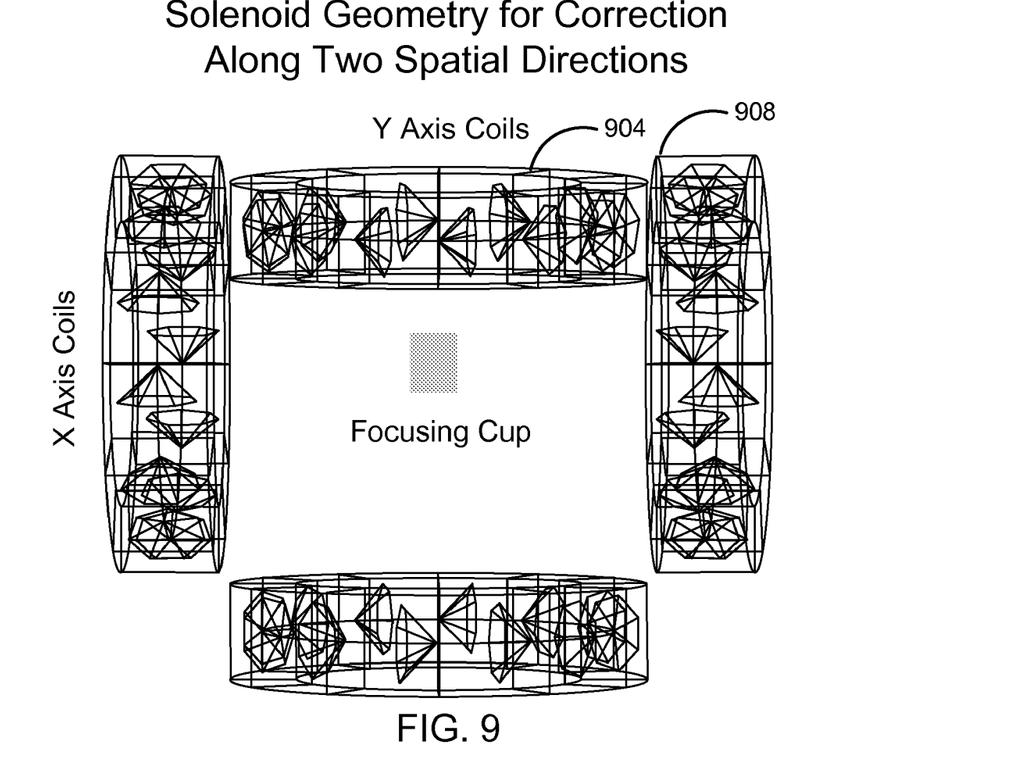
FIG. 9 shows the FEM with solenoids placed along both the X and Y axis.

Correcting for external fields along the Z axis is more difficult because it would require placing solenoids within the tube housing, which raises concerns about important standoff requirements from any high voltage surface. In order to avoid placing coils inside the housing the system geometry was altered by rotating the tube 90 degrees about Y. This caused the longitudinal fringe field (~250 Gauss) to be oriented along X instead of Z, while the radial fringe field (~1000 Gauss) was still oriented along Y. With this new geometry it was possible to correct for the longitudinal fringe field by placing another pair of deflection coils along the X axis, as shown in FIG. 9. FIG. 9 shows the FEM with solenoids placed along both the X and Y axis. The solenoids along the Y axis 904 are identical to those in FIG. 7. The solenoids along the X axis 908 are placed equidistant from the focusing cup (92 mm from electron beam to inner face) and carry a current density of 7.5 A/mm 2. The inner and outer radii are 60 and 88 mm respectively, and the length of each solenoid along the x-axis is 40 mm.

Figure 10:
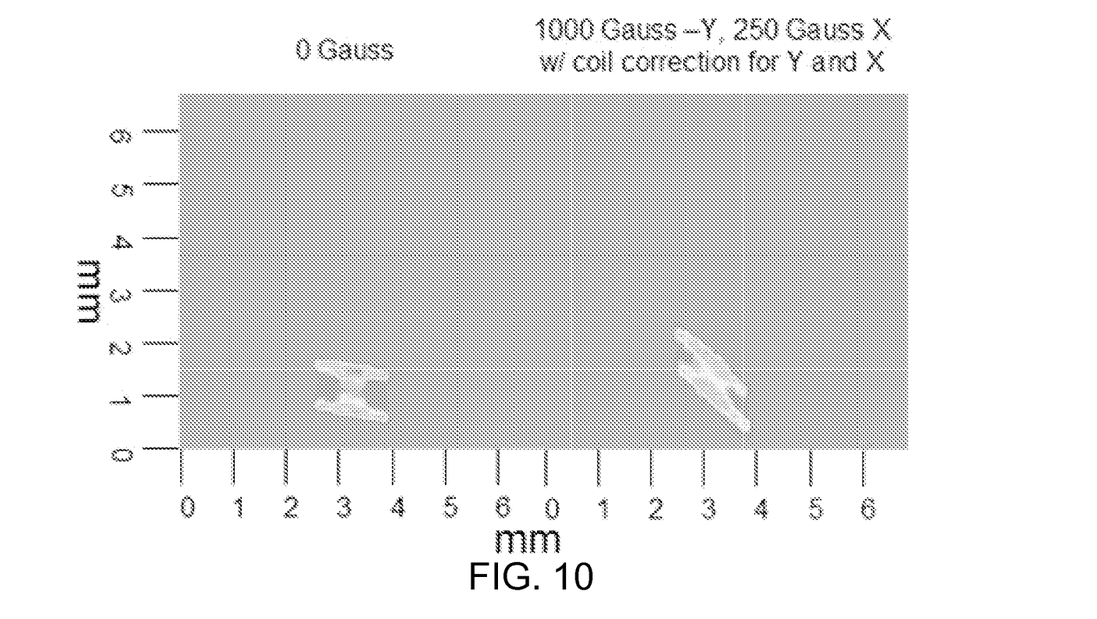
FIG. 10 shows a simulated focal spot comparison between no external field (0 Gauss) and a large magnitude multi-directional external field (1000 Gauss-Y, 250 Gauss X) with coil correction along Y and X.

The results from the simulation for this setup are displayed in FIG. 10. FIG. 10 shows the simulated focal spot comparison between no external field (0 Gauss) and a large magnitude multi-directional external field (1000 Gauss-Y, 250 Gauss X) with coil correction along Y and X. FIG. 10 demonstrates an improvement from the previous setup when there was only coil correction along the Y axis. Specifically, a significant portion of the blurring has been removed and the original shape of the focal spot is still preserved. By optimizing the current values in the solenoids to match the external field values it will also be possible to reduce the slanting effects seen. The only downside to this setup is that the motor will be positioned slightly farther away from the magnet than before, which will reduce the value of the radial fringe field at the motor.

As long as there is a sufficiently strong MR external magnetic field with a component perpendicular to the rotor the motor may reach a desired speed. To provide such a field, the motor's placement in the magnetic field and angle of orientation with respect to the magnetic field may be adjusted.

Since the coils are on the rotor and move instead of being stationary in the housing and since the motor is brushless, the motor may be referred to as a brushless DC motor with an inverted design in addition to not having any permanent magnets in the housing surrounding the rotor coils. Preferably, the brushless contacts are vacuum contacts. In the above example, the vacuum contacts where provided by the bearings.

Preferably, an embodiment of the invention is able to work within about 1 meter from the center of the MRI bore.

In other embodiments instead of a 3 phase motor, another number of phases may be used, such as a 4 phase motor.

An embodiment may use a sensor to measure the external magnetic field to provide a signal to the active timer to provide the active timer information regarding the magnitude of the MR external magnetic field and the orientation of the MR external magnetic field. Such a sensor may be a Hall sensor. The active timer may use such information to determine timing, voltage amplitude, or polarity.

Other embodiments of the invention may use the motor that uses the external MR magnetic field for other uses instead of rotating an anode.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. An apparatus for use in a magnetic resonance (MR) system, which generates an external MR magnetic field, comprising:
   a rotor, comprising:
      a rotor shaft with an axis along a length of the rotor shaft; and
      a plurality of coils on the rotor shaft;
   a housing supporting and surrounding the rotor, wherein a part of the housing surrounds sides of the rotor, wherein the part of the housing surrounding sides of the rotor is magnet free;
   a mount for mounting the housing to the MR system in a location where the MR system provides a magnetic field, wherein a component of the MR magnetic field that is perpendicular to the axis of the rotor shaft is at least 100 Gauss;
   an active timer for applying a voltage to the plurality of coils with alternating polarity; and
   contacts for providing an electrical connection between the active timer and the plurality of coils.

2. The apparatus, as recited in claim 1, wherein the contacts are vacuum contacts.

3. The apparatus, as recited in claim 2, further comprising a sensor for measuring rotor position.

4. The apparatus, as recited in claim 3, further comprising an anode connected to the rotor, wherein the rotor rotates the anode.

5. The apparatus, as recited in claim 4, further comprising an e-beam generator spaced apart from the anode.

6. The apparatus, as recited in claim 5, further comprising a plurality of shielding magnets spaced around a path between the e-beam generator and the anode.

7. The apparatus, as recited in claim 6, further comprising:
   an external magnetic field sensor;
   a controller connected to the external magnetic filed sensor and the plurality of shielding magnets, wherein the controller receives a signal from the external magnetic field sensor related to the strength of the external magnetic field and controls the plurality of shielding magnets according to the strength of the external magnetic field.

8. The apparatus, as recited in claim 7, wherein the active timer is a 3-phase DC motor active timer.

9. The apparatus, as recited in claim 8, wherein the contacts are brushless contacts.

10. The apparatus, as recited in claim 3, wherein the sensor is a Hall sensor system.

11. The apparatus, as recited in claim 3, wherein the active timer applies voltage to the plurality of coils based on the measured rotor position in relation to the external MR magnetic field.

12. The apparatus, as recited in claim 3, wherein the sensor is a back EMF control system.

13. The apparatus, as recited in claim 1, wherein the active timer applies voltage to the plurality of coils based on the measured rotor position in relation to the external MR magnetic field.

14. An x-ray tube for use in a magnetic resonance (MR) system, which generates an external MR magnetic field, comprising:
   an anode;
   a motor for rotating the anode;
   a cathode is spaced apart from the anode;
   an external magnetic field sensor that measures the external MR magnetic field;
   a plurality of active shielding magnets spaced surrounding a path from the cathode to the anode;

a controller connected to the external magnetic field sensor and the plurality of active shielding magnets.

15. The x-ray tube, as recited in claim 14, wherein the controller comprises computer readable media with computer readable code for using a signal from the external magnetic field sensor and adjusting a magnetic field produced by the plurality of active shielding magnets according to the signal from the external magnetic field sensor.

16. The x-ray tube, as recited in claim 15, wherein the active shielding magnets are coils.

17. An x-ray tube for use in a magnetic resonance (MR) system, which generates an external MR magnetic field, comprising:
- an anode;
- a motor for rotating the anode, comprising:
  - a rotor, comprising:
    - a rotor shaft with an axis along a length of the rotor shaft; and
    - a plurality of coils on the rotor shaft;
  - a housing supporting and surrounding the rotor, wherein a part of the housing surrounds sides of the rotor, wherein the part of the housing surrounding sides of the rotor is magnet free;
  - a mount for mounting the housing to the MR system in a location where the MR system provides a magnetic field, wherein a component of the MR magnetic field that is perpendicular to the axis of the rotor shaft is at least 100 Gauss;
  - an active timer for applying a voltage to the plurality of coils with alternating polarity; and
  - contacts for providing an electrical connection between the active timer and the plurality of coils; and
- a cathode spaced apart from the anode.

18. The x-ray tube, as recited in claim 17, further comprising:
- an external magnetic field sensor that measures the external MR magnetic field;
- a plurality of active shielding magnets spaced surrounding a path from the cathode to the anode; and
- a controller connected to the external magnetic field sensor and the plurality of active shielding magnets.

* * * * *